United States Patent
Hanoka

(10) Patent No.: US 6,320,116 B1
(45) Date of Patent: *Nov. 20, 2001

(54) METHODS FOR IMPROVING POLYMERIC MATERIALS FOR USE IN SOLAR CELL APPLICATIONS

(75) Inventor: Jack I. Hanoka, Brookline, MA (US)

(73) Assignee: Evergreen Solar, Inc., Waltham, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/938,147

(22) Filed: Sep. 26, 1997

(51) Int. Cl.[7] .................................. H01L 31/0203

(52) U.S. Cl. ................................ 136/251; 136/259

(58) Field of Search ........................ 136/251, 259, 136/249

(56) References Cited

U.S. PATENT DOCUMENTS

| | | | |
|---|---|---|---|
| 3,261,074 | 7/1966 | Beauzee | 29/25.3 |
| 3,489,615 * | 1/1970 | Mann et al. | 136/89 |
| 3,502,507 | 3/1970 | Mann | 136/89 |
| 3,903,427 | 9/1975 | Pack | 250/578 |
| 3,903,428 | 9/1975 | DeJong | 250/578 |
| 3,990,100 | 11/1976 | Mamine et al. | 357/30 |
| 4,133,697 | 1/1979 | Frosch et al. | 136/245 |
| 4,135,290 | 1/1979 | Evans | 437/2 |
| 4,173,820 | 11/1979 | Frosch et al. | 437/2 |
| 4,210,462 * | 7/1980 | Tourneux | 136/89 |
| 4,268,339 | 5/1981 | Urban . | |
| 4,358,331 | 11/1982 | Schmidt et al. . | |
| 4,361,950 * | 12/1982 | Amick | 29/572 |
| 4,415,607 | 11/1983 | Denes et al. | 427/96 |
| 4,415,780 | 11/1983 | Daugherty et al. | 200/5 A |
| 4,499,658 * | 2/1985 | Lewis | 29/588 |
| 4,543,444 | 9/1985 | Rasch et al. | 136/256 |
| 4,610,077 * | 9/1986 | Minahan et al. | 29/572 |

(List continued on next page.)

FOREIGN PATENT DOCUMENTS

| | | |
|---|---|---|
| 24 45 642 | 4/1976 | (DE) . |
| 0 680 096 | 11/1995 | (EP) . |
| 06334207 | 2/1994 | (JP) . |
| WO 8912911 | 6/1989 | (WO) . |

OTHER PUBLICATIONS

Tachino et al., "Structure and Properties of Ethylene Ionomers Neutralized with Binary Metal Cations," Macrmolecules, 27: 372–378, 1994.*

Gee et al., "Emitter Wrap–Through Solar Cell," IEEE, pp. 265–270, 1993.*

*Technical Information Bulletin*, by Philadelphia Decal, (1993), pp. 1–2.

"How to Use Decals in Decorating", Philadelphia Ceramics, Inc., pp. 1–4.

"The Making of A Decal", *The Plate Collector*, Dec. 1985, pp. 33–35.

(List continued on next page.)

Primary Examiner—Ellis Robinson
Assistant Examiner—Michael C. Miggins
(74) Attorney, Agent, or Firm—Testa, Hurwitz & Thibeault, LLP

(57) ABSTRACT

A method of manufacturing a solar cell module includes the use of low cost polymeric materials with improved mechanical properties. A transparent encapsulant layer is placed adjacent a rear surface of a front support layer. Interconnected solar cells are positioned adjacent a rear surface of the transparent encapsulant layer to form a solar cell assembly. A backskin layer is placed adjacent a rear surface of the solar cell assembly. At least one of the transparent encapsulant layer and the backskin layer are predisposed to electron beam radiation.

14 Claims, 2 Drawing Sheets

U.S. PATENT DOCUMENTS

| | | | |
|---|---|---|---|
| 4,636,578 | * 1/1987 | Feinberg | 136/251 |
| 4,692,557 | 9/1987 | Samuelson et al. | 136/251 |
| 4,755,866 | 7/1988 | Marshall et al. | 357/81 |
| 4,758,926 | 7/1988 | Herrell et al. | 361/385 |
| 4,849,028 | 7/1989 | Krause | 136/201 |
| 4,860,444 | 8/1989 | Herrell et al. | 29/840 |
| 4,897,123 | 1/1990 | Mitsui | 136/256 |
| 4,912,288 | 3/1990 | Atkinson et al. | 174/251 |
| 4,966,631 | 10/1990 | Matlin et al. | 136/244 |
| 5,055,907 | 10/1991 | Jacobs | 357/71 |
| 5,108,541 | 4/1992 | Schneider et al. | 156/631 |
| 5,116,459 | 5/1992 | Kordus et al. | 156/631 |
| 5,118,362 | 6/1992 | St. Angelo et al. | 136/256 |
| 5,143,556 | 9/1992 | Matlin | 136/244 |
| 5,151,377 | 9/1992 | Hanoka et al. | 437/2 |
| 5,270,248 | 12/1993 | Rosenblum et al. | 437/160 |
| 5,352,530 | * 10/1994 | Tanuma et al. | 428/442 |
| 5,425,816 | 6/1995 | Cavicchi et al. | 136/256 |
| 5,476,553 | * 12/1995 | Hanoka et al. | 136/251 |
| 5,478,402 | 12/1995 | Hanoka | 136/251 |
| 5,507,880 | * 4/1996 | Ishikawa et al. | 136/251 |
| 5,578,142 | * 11/1996 | Hattori et al. | 136/251 |
| 5,620,904 | 4/1997 | Hanoka | 438/98 |
| 5,660,646 | * 8/1997 | Kataoka et al. | 136/251 |
| 5,741,370 | * 4/1998 | Hanoka | 136/251 |

OTHER PUBLICATIONS

Cavicchi et al., "Large Area Wraparound Cell Development", *IEEE*, 1984, pp. 128–133.

Michaels et al., "Large Area, Low Cost Space Solar Cells with Optional Wraparound Contacts", *IEEE*, 1981, pp. 225–227.

Mason et al., "Development of 2.7 mil BSF and BSFR Silicon Wrapthrough Solar Cells", *IEEE*, 1990, pp. 1378–1382.

Gee et al., "Emitter Wrap–Through Solar Cell", *IEEE*, 1993, pp. 265–270.

Thornhill, Final Report—Automated Fabrication of Back Surface Field Silicon Solar Cells with Screen Printed Wraparound Contacts, prepared for NASA, 1977, pp. 1–30.

Product Brochure for Formion®Formulated Ionomer, by A. Schulman Inc., Resins, pp. 1–3.

*The Rotary Press*, newsletter from Philadelphia Decal, vol. I, Issue No. 2, Sep. 1993, pp. 1–2.

Baker et al., "Introduction of Acrylate Copolymer Based Ionomer Resins for Packaging Applications", pp. 1–20.

Sauer et al., "Poly(methyl methacrylate) Based Ionomers. 1. Dynamic Mechanical Properties and Morphology," *Macromolecules*, 28:3953–3962 (1995).

Hara et al., "Solution Properties of Ionomers. 2. Simple Salt Effect," *Macromolecules*, 22:754–757 (1989).

Hara et al., "Fatigue Behavior of Ionomers. 3. Effect of Excess Neutralizing Agent on Sulfonated Polystyrene Ionomers," *Macromolecules*, 23:4964–4969 (1990).

Douglas et al., "Viscoelastic and Morphological Study of Ionic Aggregates in Ionomers and Ionomer Blends," *Macromolecules*, 27:4344–4352 (1994).

Vermes et al. (Jul. 1965) Crosslinking the New Ethylene Copolymers *Plastics Technology*.

* cited by examiner

METHODS FOR IMPROVING POLYMERIC MATERIALS FOR USE IN SOLAR CELL APPLICATIONS

GOVERNMENT INTEREST

The subject matter described herein was supported in part by Photovoltaic Manufacturing Technology (PVMaT) Contract No. ZAF-5-14271-09.

FIELD OF THE INVENTION

This invention relates to polymeric materials for solar cell applications and methods for improving properties of low cost polymeric materials for solar cell applications. More particularly, this invention relates to low cost polymeric materials with improved properties for solar cell applications and methods for improving the properties of such polymeric materials for solar cell applications while maintaining their low cost.

BACKGROUND

Polymeric materials are commonly used in the manufacture of solar cell modules. Specifically, polymeric materials are principally used as encapsulants for solar cells and as backskin materials in solar cell modules. For crystalline silicon solar cells, the cells can be encapsulated such that a transparent encapsulant is used between a transparent superstrate (usually glass) and the solar cell. In this case, a second layer of encapsulant, which may be pigmented, can be used between the solar cells and the backskin material. For thin film solar cell modules (e.g., amorphous silicon, cadmium telluride, or copper indium diselenide) a single layer of encapsulant is employed.

With the heightened interest in solar cell modules in architectural applications, there has developed an even greater need than ever before for materials which are used in solar cell modules that can show high resistance to thermal creep at temperatures as high as 90° C. Such temperatures have been reached in some architectural applications. temperatures have been reached in some architectural applications.

As used herein, the term "thermal creep" refers to permanent deformation of a polymer effected over a period of time as a result of temperature. Thermal creep resistance, generally, is directly proportional to the melting temperature of a polymer. For materials with low melting temperatures, it is necessary to cross-link the materials to given them higher thermal creep resistance.

Polymeric materials commonly used as transparent encapsulants include thermoplastics such as ethylene vinyl acetate (EVA) and ionomers. EVA, the most commonly used material, is a co-polymer of vinyl acetate and ethylene. Ionomers are copolymers of ethylene and methacrylic acid with a salt added to neutralize them. Ionomers can be used alone or with metallocene polyethylene. Metallocene polyethylene can be a copolymer (or comonomer) of ethylene and hexene, butene, or octene. Encapsulant materials comprising both ionomers and metallocene polyethylene are described in a commonly owned U.S. patent application, entitled "Encapsulant Material for Solar Cell Module and Laminated Glass Applications, Ser. No. 08/899,512, filed Jul. 24, 1997.

These polymeric materials each address the thermal creep resistance problem in a different manner. For EVA, which has a rather low melting point, chemical cross-linking is used to provide thermal creep resistance. An organic peroxide is added to the EVA and cross-links it using the heat of a lamination process. A problem with this chemical cross-linking procedure is connected with the fact that total cross-linking is not fully achieved. Therefore, the peroxide used as the cross-linking agent is not completely used up during the process and excess peroxide remains in the laminated EVA. The remaining peroxide can promote oxidation and degradation of the EVA encapsulant. Also, the addition of some organic peroxides to the EVA sheet extrusion process require stringent temperature control to avoid premature cross-linking in the extruder chamber. This makes EVA with this peroxide addition difficult to rhanufacture into sheet. Ionomers do not require chemical cross-linking agents. Instead, thermal creep resistance is provided by the built-in cross linking which the ionically bonded regions in the ionomers provide. Metallocene polyethylene can have melting temperatures of about 100° C., anywhere from 5 to 15° C. higher than ionomers and about 40° C. higher than EVA which has not been cross-linked. Thus, they can exhibit better thermal creep resistance simply by virtue of their higher melting temperature. However, even higher creep resistance may be called for than presently exists for any of these encapsulants.

Polymeric materials commonly used as backskin layers include a Tedlar (i.e., a DuPont trade name for a type of polyvinyl difluoride) laminate, polyolefins and polyolefin mixtures. Backskin layers of solar cell modules require thermal creep resistance at temperatures considerably greater than 90° C. to satisfy a certification test known as the Relative Thermal Index (RTI). Thermal creep resistance at temperatures at or above about 150° C. are called for to satisfy the RTI test. The Tedlar laminate now widely used does satisfy the RTI requirement but it has other limitations. It is expensive, requires an additional edge seal and is thin, the entire laminate being about 0.010 inches thick and the Tedlar only about 0.002 inches thick.

Polymeric materials that can be used as backskin layers to form frameless modules should also exhibit thermoplastic properties during lamination, which is typically performed at temperatures on the order of 140° C.–175° C. One type of frameless solar cell module is described in commonly owned U.S. patent application, entitled "Solar Cell Modules with Improved Backskin and Methods for Forming Same, Ser. No. 08/671,415, filed on Jun. 27, 1996. For such modules, the backskin material must be capable of being softened, molded and formed during lamination (i.e., it must exhibit enough thermoplastic behavior to allow for this, while still exhibiting enough thermal creep resistance to satisfy RTI requirements).

SUMMARY OF THE INVENTION

The present invention features methods of manufacturing solar cell modules with improved thermal creep resistance. In one aspect, polymeric materials used in the manufacture of solar cell modules are subjected to electron beam radiation, which cross-links the polymeric materials without entirely eliminating their thermoplastic properties. In one embodiment, a backskin layer is irradiated by a high energy electron beam before being used to form the solar cell module, resulting in the backskin material having vastly improved thermal creep resistance and the capability to pass an RTI test. In another embodiment, one or more transparent encapsulant layers are irradiated by a high energy electron beam to increase their thermal creep resistance and then used to form a solar cell module.

In another aspect, the invention features methods of interconnecting solar cells which have wraparound contacts.

A metal interconnection pattern is placed on a backskin layer that is predisposed to electron beam radiation. The backskin layer with the metal interconnection pattern is placed adjacent rear surfaces of the solar cells. The cells can then be interconnected by merely being placed down on this backskin material and bonded using either a conductive epoxy or by being soldered. In this way, a monolithic module can be formed. Thermal creep resistance at T≅is called for here and can be obtained using the results of this invention.

In yet another aspect, the invention features a solar cell module with improved thermal creep resistance. The solar cell module includes a transparent superstrate, at least one transparent encapsulant layer, interconnected solar cells and a backskin layer. Either or both of the transparent encapsulant layer and the backskin layer are predisposed to an electron beam radiation to form highly cross-linked polymers, while still maintaining some thermoplastic qualities.

In still another aspect, one or more polymeric bonding layers that are predisposed to an electron beam radiation seal components to a solar cell module. By irradiating the polymeric bonding layers, the polymeric material is cross-linked while still maintaining the surface bonding properties of the layers. In one embodiment, a backskin layer of a solar cell module wraps around edges of the solar cell module to form an edge seal. A bonding layer that is predisposed to electron beam radiation is placed in between the backskin layer and a front surface of a transparent superstrate to bond the wrapped portion of the backskin to the front support layer.

In another embodiment, a bonding layer that is predisposed to an electron beam radiation seals electrical leads to a rear surface of the backskin. In yet another embodiment, a bonding layer that is predisposed to an electron beam radiation bonds mounting elements to a backskin of a solar cell module. In yet another embodiment, polymeric layers which are used to electrically isolate current carrying leads vertically disposed relative to each other but separated by these polymeric layers are electron beam irradiated to further enhance their electrical insulation properties.

BRIEF DESCRIPTION OF THE DRAWINGS

These and other features of the invention are more fully described below in the detailed description and accompanying drawings of which the figures illustrate the solar cell modules and solar cells embodying the improved polymeric materials of the present invention.

DETAILED DESCRIPTION

The present invention features improved polymeric materials for solar cell applications and methods of improving mechanical and electrical properties of low cost polymeric materials for solar cell applications. The polymeric materials used as a backskin layer and/or a transparent encapsulant layer prepared according to the present invention possess improved thermal creep resistance while retaining enough thermoplasticity to be bonded to themselves or other materials. The present invention achieves these results while maintaining the low cost of the materials.

In accordance with the invention, polymeric materials used in manufacturing solar cell modules are irradiated with a high energy electron beam radiation. This irradiation procedure produces cross-linking in the polymeric materials without changing the surface properties of the materials. The lack of change in the surface properties, along with some residue of thermoelasticity, means that these materials still are sufficiently thermoplastic to be heat bonded to other surfaces and materials. The irradiated polymeric materials show a dramatic increase in their thermal creep resistance. Although one might expect the cross-linking procedure to make the polymeric material thermosets, and therefore, inapplicable to solar cell applications, the polymeric materials can be irradiated to a point where they still retain some thermoplastic properties. As used herein, the term "thermoset" refers to a polymer's quality of solidifying when either heated or reacted chemically without being able to be remelted or be remolded. Also, as used herein, the term "thermoplastic" refers to a material's quality of repeatedly softening when heated and hardening when cooled. A thermoplastic polymeric material is able to bond to an adjacent surface and be molded during a lamination procedure.

Figure 1:
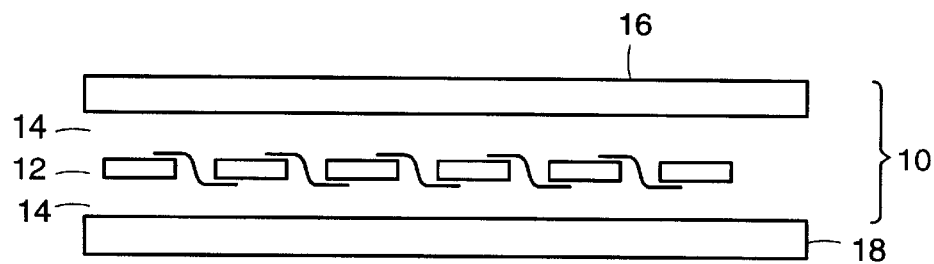
FIG. 1 shows one possible way in which an irradiated encapsulant can be deployed in a photovoltaic module.

Referring to FIG. 1, a solar cell module 10 includes a series of interconnected solar cells 12 surrounded by a transparent encapsulant layer 14. A front support layer 16 covers a front surface of the portion of the transparent encapsulant layer disposed over the interconnected solar cells 12. A backskin layer 18 supports a rear surface of the portion of the transparent encapsulant layer 14 disposed on a rear surface of the interconnected solar cells 12.

In one embodiment, the transparent encapsulant layer 14 has been predisposed to high energy electron beam radiation. The radiation dosage used in irradiating the transparent encapsulant layer 14 is sufficient to significantly increase the thermal creep resistance of the material without having the material turn into a completely thermoset polymer. The transparent encapsulant layer 14 is sufficiently thermoplastic as to soften under heat and pressure, filling all the empty spaces within the solar cell module 10 and bond securely to all adjacent surfaces including the front support layer 16, the interconnected solar cells 12, and the backskin layer 18.

The irradiated transparent encapsulant layer 14 may consist of any number of polymeric materials. In the embodiments described below, the irradiated transparent encapsulant layer 14 comprises copolymers of ethylene. In one embodiment, ethylene vinyl acetate (EVA), a copolymer of vinyl acetate and ethylene, is used. In another embodiment, the irradiated transparent encapsulant layer 14 is an ionomer. The ionomer layers can be derived from any direct or grafted ethylene copolymer of an alpha olefin having the formula R—CH=CH$_2$, where R is a radical selected from the class consisting of hydrogen and alkyl radicals having from 1 to 8 carbon atoms and alpha, beta-ethylenically unsaturated carboxylic acid having from 3 to 8 carbon atoms. The acid moieties are randomly or non-randomly distributed in the polymer chain. The alpha olefin content of the copolymer can range from 50–92% while the unsaturated carboxylic acid content of the copolymer can range from about 2 to 25 mole percent, based on the alpha olefin-acid copolymer, and said acid copolymers having from 10 to 90 percent of the carboxylic acid groups ionized by neutralization with metal ions from any of the group I, II or III type metals.

In another embodiment, the irradiated transparent encapsulant layer 14 comprises a layer of metallocene polyethylene disposed between two layers of ionomer. The layer of metallocene polyethylene can comprise a copolymer (or comonomer) of ethylene and hexene, octene, and butene, and the first and second layers of ionomer can have at least 5% free acid content. The layers of metallocene polyethylene and ionomer are substantially transparent. In one detailed embodiment, the metallocene polyethylene is ethylene alpha-olefin comprising comonomer of octene, and the ionomer is a sodium ionomer comprising methacrylic acid. An encapsulant material which is a combination of two materials allows for the exploitation of the best properties of each material while overcoming the limitations of each material if used alone. The outer ionomer layers allow the encapsulant material to bond very strongly to all the adjacent surfaces. The inner metallocene polyethylene layer which forms the bulk of the encapsulant material is a highly transparent, low cost thermoplastic material. The two ionomer layers are thin (i.e., the order of 0.001" thick), and have a high acid content (i.e., at least 5% free acid). The high acid content provides for strong adhesion and cohesive bond failure and increased light transmission. The metallocene polyethylene, which has some comonomer of octene, is known to have excellent optical clarity and improved physical properties because the catalyst method used results in a narrow molecular weight distribution.

For the vast majority of the co-polymers of polyethylene, the radiation dosage used to irradiate the transparent encapsulant layer 14 is approximately in the range of about 2 megarads to about 12 megarads. However, for EVA, it has been found that doses of 12–16 megarads work best. The following table shows the improvement in thermal creep resistance for three different co-polymers of polyethylene: EVA, Ionomer, and a coextrusion of Ionomer-Metallocene polyethylene-Ionomer (IMI). The percentage elongation is a measure of thermal creep resistance-the lower it is, the higher is the thermal creep resistance. The EVA was not done above 100° C., since it was clear that it did not perform as well as the other two samples even at 100° C.

| Material | Temp (° C.) | Time (hrs.) | Irradiation Level (megarads) | % Elongation |
|---|---|---|---|---|
| EVA (Peroxide cross-linked) | 100 | 14 | None | 12 |
| EVA | 100 | 14 | 16 mr | 4 |
| Ionomer | 100 | 14 | None | no change |
| Ionomer | 100 | 14 | 4 mr | no change |
| IMI | 100 | 14 | None | no change |
| IMI | 100 | 14 | 2 mr | no change |
| Ionomer | 110 | 4 | None | 50 |
| Ionomer | 110 | 4 | 4 mr | 25 |
| IMI | 110 | 4 | None | 25 |
| IMI | 110 | 4 | 2 mr | 12 |

In another embodiment, the backskin layer 18 is predisposed to an electron beam radiation. The irradiated backskin layer 18 is sufficiently thermoplastic such that it maintains its ability to bond to an adjacent surface and be flexible enough to wrap around a solar cell assembly if desired.

In one detailed embodiment, the irradiated backskin layer 18 comprises a polyolefin. In another detailed embodiment, the polyolefin is a high density polyethylene or polypropylene. In another detailed embodiment, the irradiated backskin layer 18 comprises a mixture of polyolefins with or without mineral fillers. One example of a mixture of polyolefins is a mixture of Zn and Na ionomers along with a mineral filler. The effects of irradiation on such a material are very dramatic as evidenced by thermal creep experiments shown in the following table:

| | Temperature (° C.) | Time (hrs) | % Elongation |
|---|---|---|---|
| Non-irradiated 1" × 6" strip | 110 | 4 | 50–100% |
| Irradiated 1" × 6" strip | 300 | 12 | 5% |

The radiation dosage used to irradiate the backskin layer 18 is approximately in the range of about 8 megarads to about 16 megarads.

In one embodiment, the irradiated polymeric material or materials are predisposed to electron beam radiation before being included in a solar cell module. After a polymeric material is prepared into a sheet form, the polymer sheet is treated with an electron beam radiation. The treatment can be performed on stocks of cut sheet or on rolls of the sheet, making this procedure batch processable and inexpensive.

Figure 2:
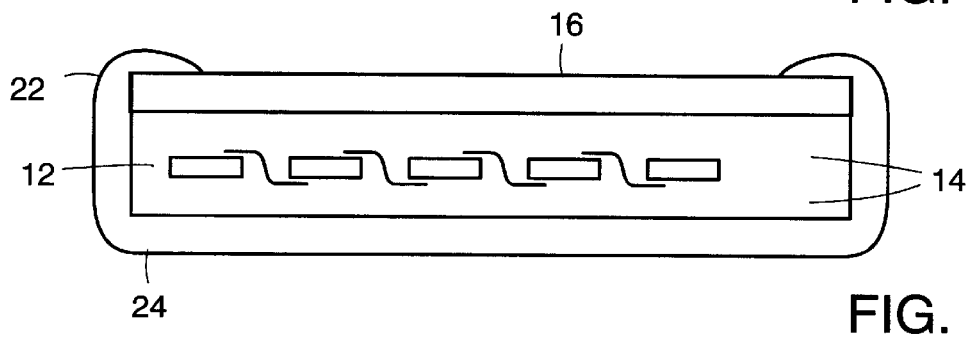
FIG. 2 shows one possible way in which an irradiated backskin material can be deployed in a photovoltaic module.

Referring to FIG. 2, a portion 22 of the backskin layer 24 is wrapped around the edges of the solar cell assembly 12 and contacts a front surface of the front support layer 16 to form an edge seal. As used herein, the term "solar cell assembly" refers to the combination of interconnected solar cells 12 and the transparent encapsulant layer or layers 14. Either or both of the backskin layer 24 and the transparent encapsulant layer 14 may comprise irradiated cross-linked polymer.

Figure 3:
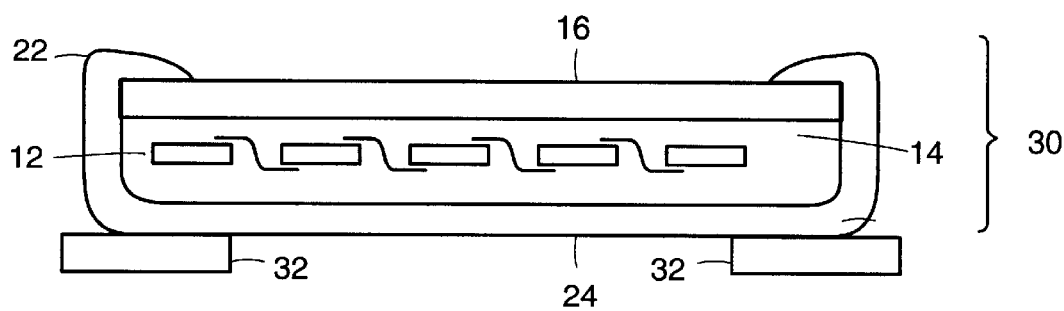
FIG. 3 shows one possible way in which a mounting component can be bonded directly onto the irradiated backskin.

Referring to FIG. 3, a solar cell module 30, which is identical to the one shown in FIG. 2, further includes mounting elements 32 attached to a rear surface of the backskin layer 24 supporting the solar cell assembly 12. Either or both of the backskin layer 24 and the transparent encapsulant layer 14 may comprise irradiated cross-linked polymer.

Figure 4:
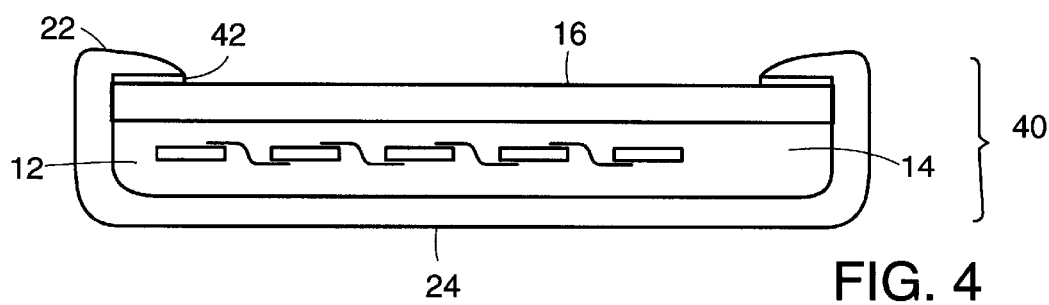
FIG. 4 illustrates the use of an irradiated intermediate bonding layer to bond the backskin material to the front superstrate.

Referring to FIG. 4, a solar cell module 40 has an intermediate bonding layer 42 used to bond the backskin material 24 as it wraps around to the front of the module 22. This intermediate bonding layer 42 facilitates bonding of the backskin 22 to the glass superstrate 16.

In one aspect, the intermediate bonding layer 42 can be predisposed to an electron beam radiation. The bonding layer comprises an irradiated layer of an acid co-polymer of polyethylene. Examples include ethylene methacrylic acid (EMA) and ethylene acrylic acid (EAA). These materials form an unusually strong bond due to their acid functionality. The strong bonding capability is maintained even after irradiation. Therefore, they possess both strong bonding capability and strong thermal creep resistance after they are irradiated.

Figure 5:
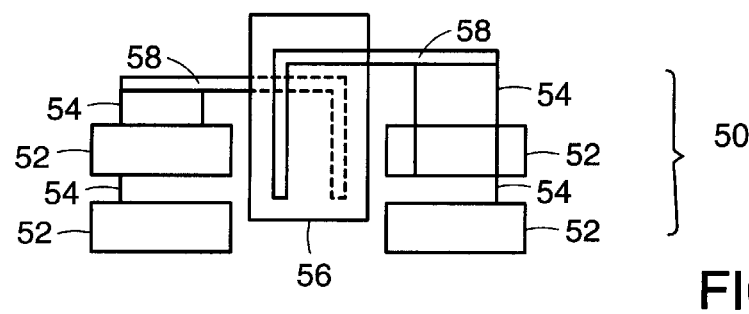
FIG. 5 illustrates the use of an irradiated strip as an electrical insulating layer in module layout.

In FIG. 5, a solar cell module 50 includes a plurality of solar cells 52 interconnected by electrical leads 54 and a wider leads 58. An electrically insulating layer 56 formed of irradiated polymeric material serves to electrically insulate different sets of electrical leads from each other. Presently, a variation of PET (Polyethylene Terephthalate) or nylon is used. These materials, however, do not bond readily with polyolefin based encapsulants and delamination has been known to occur when these materials have been used. Irradiated polymer materials such as any of the copolymers of ethylene already mentioned when used as an electrical insulating layer solve this problem.

Figure 6:
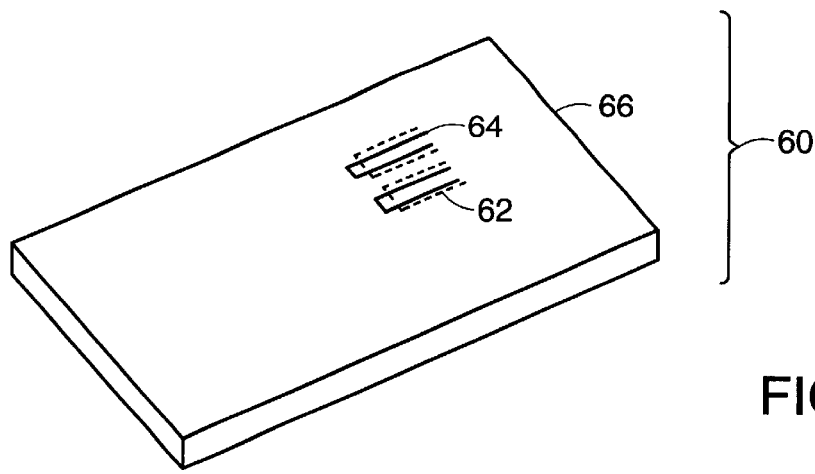
FIG. 6 shows how an irradiated material could be used to seal around the electrical leads emerging from a module.

Referring to FIG. 6, a pair of irradiated bonding layers 62 are employed to bond at least a portion of the electrical leads 64 to a rear surface of the backskin layer 66 of a solar cell module 60.

Figure 7:
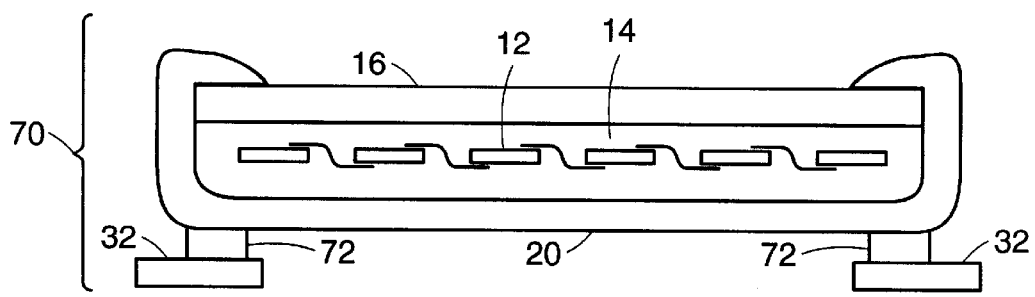
FIG. 7 shows how an intermediate irradiated boding layer can be used to bond a mounting component to the irradiated backskin.

Referring to FIG. 7, a pair of irradiated bonding layers 72 bond mounting elements 32 to a rear surface of the backskin layer 24 of a solar cell module 70. The solar cell module 70 includes interconnected solar cells 12, the transparent encapsulant layer 14, the front superstrate layer 16 and the backskin layer 24.

Figure 8:
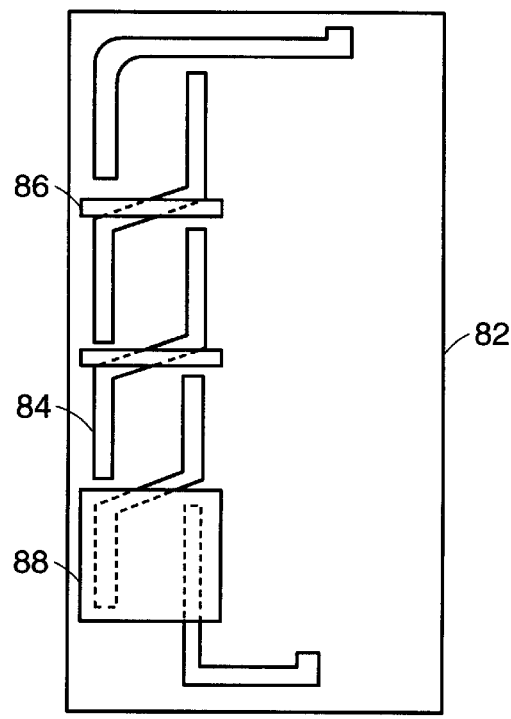
FIG. 8 illustrates interconnection wires which are pre-bonded to the irradiated backskin.

Referring to FIG. 8, an irradiated backskin material 82 which has high thermal creep resistance and displays thermoplastic properties even at temperatures exceeding 250° C. is used as a polymer sheet base material upon which a metal conducting pattern 84 is bonded. Thin layers of an electrically insulating material 86 (such as layer 56 in FIG. 5) can be applied over the metal conducing pattern 84 to electrically insulate adjacent solar cells 88. The pattern 84 is designed to facilitate the connecting together of wraparound contact solar cells 88. One type of wraparound contact is described in commonly owned U.S. Pat. No. 5,620,904. An advantage of a wraparound contact is that both a front contact and a rear contact can be accessible from the rear side such that interconnection of the solar cells becomes easier and cheaper.

With a wraparound contact, a plurality of solar cells 88 can be soldered or bonded with a conductive epoxy directly onto the backskin material 82 which has a metal conducting pattern 84 bonded onto it. As a result, a monolithic module is formed. As used herein, the term "monolithic" means that all electrical connections are made on a substantially planar surface (i.e., the backskin). The irradiated backskin material 82 is able to withstand typical soldering temperatures of about 200° C. without any serious thermal creep. Also, if temperatures on the order of 150° C.–200° C. are needed to cure any conductive epoxy which may be used, this will not be a problem for the same reason.

Equivalents

While the invention has been particularly shown and described with references to specific preferred embodiments, it should be understood by those skilled in the art that various changes in form and detail may be made therein without departing from the spirit and scope of the invention as defined by the appended claims.

What is claimed is:

1. A solar cell module comprising:
a support layer formed of light transmitting material;
a transparent encapsulant layer adjacent a rear surface of the front support layer, said transparent encapsulant layer comprising:
a first outer layer of an acid copolymer of polyethylene;
an inner layer of metallocene polyethylene located adjacent a rear surface of the first outer layer;
a second outer layer of an acid copolymer of polyethylene located adjacent a rear surface of the layer of metallocene polyethylene;
a plurality of interconnected solar cells having a first surface disposed adjacent a rear surface of the transparent encapsulant layer; and
a backskin layer disposed adjacent a rear surface of the interconnected solar cells;
at least one of the transparent encapsulant and the backskin layer having an increased thermal creep resistance while remaining sufficiently thermoplastic to be heat bonded to another surface as a result of being predisposed to an electron beam radiation.

2. The solar cell module of claim 1 wherein the at least one of the transparent encapsulant layer and the backskin layer predisposed to electron beam radiation is a cross-linked polymer.

3. The solar cell module of claim 1 further comprising forming a metal conducting pattern on the backskin layer.

4. The solar cell module of claim 1 wherein the backskin layer is formed of a polyolefin.

5. The solar cell module of claim 4 wherein the polyolefin is high density polyethylene or polypropylene.

6. The solar cell module of claim 4 wherein the polyolefin comprises a mixture of at least a first ionomer and a second ionomer.

7. The solar cell module of claim 6 wherein the polyolefin further comprises a mineral filler.

8. The solar cell module of claim 1 further comprising at least one bonding layer predisposed to electron beam radiation adjacent a front surface of the front support layer and a portion the backskin layer wrapped around at least one edge of the module for contacting the at least one bonding layer adjacent the front surface of the front support layer, thereby forming an edge seal.

9. The solar cell module of claim 8 wherein the at least one bonding layer is an acid co-polymer comprising ethylene.

10. The solar cell module of claim 9 wherein the at least one bonding layer is ethylene methacrylic acid (EMAA) or ethylene acrylic acid (EAA).

11. The solar cell module of claim 1 further comprising at least one bonding layer predisposed to electron beam radiation adjacent a rear surface of the backskin layer and at least one mounting component adjacent the at least one bonding layer adjacent the rear surface of the backskin layer, thereby bonding the mounting component onto the backskin layer.

12. The solar cell module of claim 1 further comprising at least one electrical lead adjacent a rear surface of the backskin layer and at least one bonding layer predisposed to electron beam radiation adjacent the at least one electrical lead, bonding a portion of the at least one electrical lead to the backskin layer.

13. The solar cell module of claim 12 wherein the bonding layer is an acid-copolymer or an ionomer.

14. A solar cell module comprising:
a support layer formed of light transmitting material;
a transparent encapsulant layer adjacent a rear surface of the front support layer;
a plurality of interconnected solar cells having a first surface disposed adjacent a rear surface of the transparent encapsulant layer; and
a backskin layer disposed adjacent a rear surface of the interconnected solar cells;
at least one of the transparent encapsulant and the backskin layer having an increased thermal creep resistance while remaining sufficiently thermoplastic to be heat bonded to another surface as a result of being predisposed to an electron beam radiation having a dosage in a range from about 2 megarads to about 16 megarads.

* * * * *